United States Patent
Chen et al.

(10) Patent No.: US 6,299,703 B1
(45) Date of Patent: Oct. 9, 2001

(54) PROCESS FOR FABRICATING IMPROVED IRON-COBALT MAGNETOSTRICTIVE ALLOY AND ARTICLE COMPRISING ALLOY

(75) Inventors: Li-Han Chen, Ta-Hsu-Shiang (TW); Sungho Jin, Millington, NJ (US); Timothy J. Klemmer, Watchung, NJ (US); Hareesh Mavoori, Piscataway, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/500,855

(22) Filed: Feb. 9, 2000

Related U.S. Application Data

(62) Division of application No. 09/261,346, filed on Mar. 3, 1999, now Pat. No. 6,153,020.

(51) Int. Cl.[7] ........................................ H01F 1/147
(52) U.S. Cl. .................... 148/313; 420/435; 420/440
(58) Field of Search .................... 148/313, 425; 420/435–440

(56) References Cited

U.S. PATENT DOCUMENTS

| | | |
|---|---|---|
| 3,982,973 | 9/1976 | Peters et al. . |
| 4,208,254 | 6/1980 | Mitsumoto et al. . |
| 5,001,018 | 3/1991 | Takada et al. . |
| 5,252,144 | 10/1993 | Martis . |
| 5,565,830 | * 10/1996 | Sahashi et al. .................. 335/215 |
| 5,812,711 | 9/1998 | Glass et al. . |

FOREIGN PATENT DOCUMENTS 0 419 098 A1    3/1991    (EP) .

OTHER PUBLICATIONS

F. Claeyssen, et al., "Actuators transducers and motors based on giant magnetostrictive materials", *Journal of Alloys and Compounds*, vol. 258, 61, (1997).

A. E. Clark, *Ferromagnetic Materials* I, edited by E.P. Wohlfarth, North Holland, Amsterdam, Ch. 7, 531 (1980).

R. E. Newnham, "Molecular Mechanisms in Smart Materials", *MRS Bulletin*, 20, (1997).

R. C. O'Handley, "Model for strain and magnetization in magnetic shape–memory alloys", *Journal of Applied Physics*, vol. 83, No. 6, 3263 (1998).

R.C. Hall "Magnetic Anisotrophy and Magnetostriction of Ordered and Disordered Cobalt–Iron Alloys", *Trans. Metall. Society of AIME* , vol. 218, 268 (1960).

K. Ullakko, et al., "Large magnetic–field–induced stains in $Ni_2MnGa$ single crystals",*Appl. Phys. Lett.*vol. 69, No. 13, 1966 (1996).

* cited by examiner

*Primary Examiner*—John Sheehan
(74) *Attorney, Agent, or Firm*—Scott J. Rittman

(57) ABSTRACT

An article comprising an alloy exhibiting high magnetostriction in relatively low applied magnetic fields is provided, the alloy capable of being formed in a relatively easy manner and having desirable physical properties. The Co—Fe alloy of the invention exhibits a magnetostriction of at least $100 \times 10^{-6}$ in a magnetic field less than 400 Oe, advantageously in a magnetic field less than 100 Oe. The alloy is formed by plastically deforming the alloy, e.g., by cold rolling, to a reduction in cross-sectional area of at least 50%, and then heat treating the alloy to induce recrystallization. This combination of plastic deformation and recrystallization was found to provide desirable grain growth and microstructure. The resultant alloy is useful in a variety of device components, including transducers, frequency filters, signal delay lines, and optical fiber grating devices.

6 Claims, 4 Drawing Sheets

PROCESS FOR FABRICATING IMPROVED IRON-COBALT MAGNETOSTRICTIVE ALLOY AND ARTICLE COMPRISING ALLOY

This application is a division of Ser. No. 09/261,346 filed Mar. 3,1999 now U.S. Pat. No. 6,153,020.

BACKGROUND OF THE INVENTION

1. Field of the Invention

The invention relates to articles comprising magnetostrictive alloys, in particular, cobalt-iron-based magnetostrictive alloys.

2. Discussion of the Related Art

One application for highly magnetostrictive materials is magnetostrictive transducers, which convert electrical energy into mechanical energy or vice versa. Such transducers are useful for ultrasonic sound generators, magnetostrictive tuning in optical systems, acoustic delay lines, and other actuators and sensors. See, e.g., F. Claeyssen et al., *J. of Alloys and Compound*, Vol. 258, 61 (1997).

Important requirements for practical application of magnetostrictive materials include the capability to provide high saturation magnetostriction in low applied fields, ease of fabrication into a desired shape, e.g., ductility and formability of the material, and low cost. The magnetostriction of Co—Fe alloys has been studied in previous work (see, e.g., R. C. Hall, *Trans. Metal. Soc. AIME*, Vol. 218, 268 (1960)). For example, a saturation magnetostriction of $130 \times 10^{-6}$ under a field of ~2000 Oe has been obtained on a cold rolled Co-30% Fe tape after 95% deformation (see E. A. Nesbitt, *J. Appl. Phys.*, Vol. 21, 879 (1950)).

High saturation magnetostriction values in excess of $1000 \times 10^{-6}$ have been reported for $TbFe_2$ and other iron rare-earth compounds known as giant magnetostriction materials or terfenol. See, e.g., A. E. Clark, *Ferromagnetic Materials I*, edited by E. P. Wohlfarth, North Holland, Amsterdam, Chapter 7, 531 (1980), and R. E. Newnham, *MRS Bulletin*, 20 (May 1997). These materials, however, are brittle and require the use of a high magnetic field, typically 1000 Oe or higher, to obtain high magnetostriction. More recently, large magnetic-field-induced strains have been observed in magnetic shape memory alloys such as $Ni_2MnGa$. See, e.g., R. C. O'Handley, *J. Appl. Phys.*, Vol. 83, 3263 (1998) and J. K. Ulakko et al., *Appl. Phys. Lett.*, Vol. 69, 1966 (1996). These intermetallics, however, generally require single crystals or high magnetic fields to exhibit substantial magnetostriction.

Thus, improved magnetostrictive materials are desired, particular materials which not only exhibit good magnetostriction at relatively low applied field, but which are also capable of relatively easy formation, handling, and incorporation into devices.

SUMMARY OF THE INVENTION

The invention provides an alloy exhibiting high magnetostriction in relatively low applied magnetic fields, the alloy capable of being formed in a relatively easy manner and having desirable physical properties. Specifically, the Co—Fe alloy of the invention exhibits a magnetostriction of at least $100 \times 10^{-6}$ in a magnetic field less than 400 Oe, advantageously in a magnetic field less than 100 Oe. The alloy is formed by plastically deforming the alloy, e.g., by cold rolling, to a reduction in cross-sectional area of at least 50%, and then heat treating the alloy to induce recrystallization. This combination of plastic deformation and recrystallization was found to provide desirable grain growth and microstructure. Moreover, the alloy is capable of being quenched from the heat treatment temperature to provide useful ductility. The resultant alloy is useful in a variety of device components, including transducers, frequency filters, signal delay lines, and optical fiber grating devices.

Figure 1:
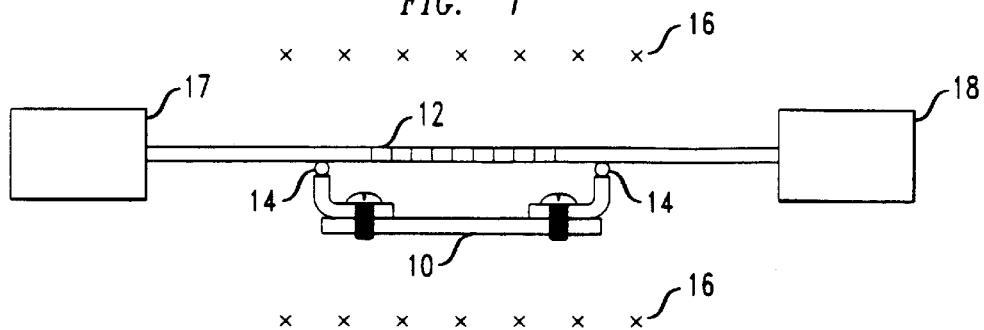
FIG. 1 illustrates a magnetostriction measurement apparatus using a fiber Bragg grating sensor.

DETAILED DESCRIPTION OF THE INVENTION (FIG. 1 illustrates an instrument with an optical fiber grating device, this apparatus used to measure the magnetostriction of alloys formed according to the invention. A change in the length of the alloy sample 10, induced by a field from solenoid 16, produces a stress on the Bragg grating 12, which is fixed to the movement of the sample 10 by adhesive bonds 14. The stress in the grating 12 alters its periodicity, such that by directing light from a source 17 into the grating and monitoring the output wavelengths with a spectrum analyzer 18, the strain is able to be calculated. In particular, the wavelength change induced by the magnetostriction strain $\epsilon_f$ of the grating 12 is expressed as $(\Delta\lambda/\lambda) = \epsilon_f(1-P_e)$, where $P_e$ is a photoelastic constant, which is about 0.22 for a silica fiber. The magnetostriction of the sample, $\epsilon_s$, is then able to be directly determined by $\epsilon_s = (l_f/l_s) \epsilon_f = (l_f/l_s) (\Delta\lambda/\lambda)/(1-P_e)$. The correcting factor $(l_f/l_s)$ is introduced to accommodate the difference in length between the fiber grating $(l_f)$ and the sample $(l_s)$. In the measurement system used herein, $l_f = 4.1$ cm and $l_s = 2.5$ cm.)

The magnetostrictive Co—Fe based alloy of the invention advantageously contains 25 to 40 weight percent Fe, with 60 to 75 weight percent being Co. Optionally, the alloy also contains one or more alloying elements selected from Cr, Ni, Mn, Cu, Zn, Al, Ti, V, Zr, Nb, Mo, Ag, Hf, Ta, W, Mg, Ca, C, N, and B, these alloying elements added for various purposes such as improved rust resistance or improved mechanical strength. The total amount of such additional alloy elements is 10 wt. % or less, advantageously 5 wt. % or less. The alloy exhibits a magnetostriction of at least $100 \times 10^{-6}$ in a magnetic field less than 400 Oe, advantageously in a magnetic field less than 100 Oe. Additionally, the alloy typically exhibits a coercivity less than 20 Oe.

To attain this desirable low-field magnetostriction, it has been found to be important to impart particular microstructure to the Co—Fe alloy. In particular, a combination of plastic deformation and heat treatment (for recrystallization) induces desirable grain growth and texture formation to provide such microstructure. Advantageously, the resultant microstructure contains a <111> fiber texture, with particularly desirable magnetostriction exhibited when this fiber texture is parallel to the measurement direction. The Co—Fe alloy typically exhibits a grain size, in average diameter, of at least 2 μm, advantageously at least 10 μm, as determined by a conventional linear intercept method. The amount of plastic deformation, provided either by hot working or cold working, is at least 50% (in reduction in cross-sectional area), advantageously at least 80%. Typically, cold rolling is used. The heat treatment typically involves heating the alloy at a temperature of about 750 to about 1200° C., advantageously about 800 to about 1000° C. The time period for heat treatment is generally about 0.1 to about 200 hrs, advantageously about 0.2 to 20 hours.

Figure 2:
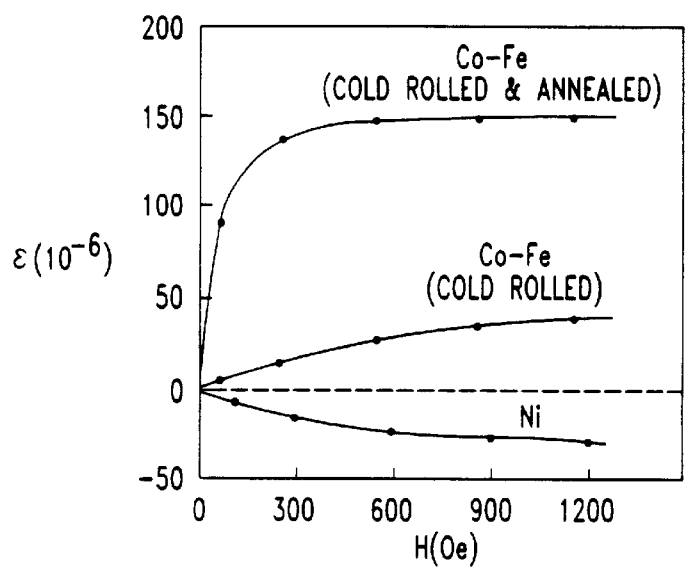
FIG. 2 shows the magnetostriction of a Co—Fe alloy of the invention, as compared to as-rolled Co—Fe and Ni.

FIG. 2 shows an example of the magnetostriction exhibited by Co—Fe alloys of the invention. Specifically, a 75% cold-rolled Co-30 wt. % Fe plate heat treated at 820° C. for 40 minutes exhibited a desirable magnetostriction of approximately $110 \times 10^{-6}$ in a field of approximately 100 Oe. This relatively large magnetostriction at low field is contrasted in FIG. 2 to a well-known magnetostrictive material—nickel—and a 75% cold-rolled Co-30% Fe with no heat treatment. The nickel and as-rolled Co—Fe exhibited a magnetostriction of less than $50 \times 10^{-6}$ in fields higher than 1000 Oe.

Figure 3:
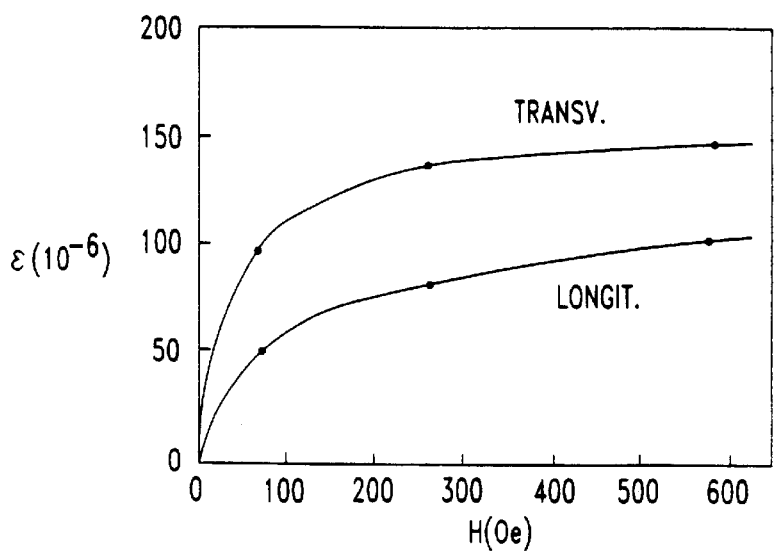
FIG. 3 shows the variation of magnetostriction with magnetic field for a Co-30% Fe alloy of the invention.
Figure 4:
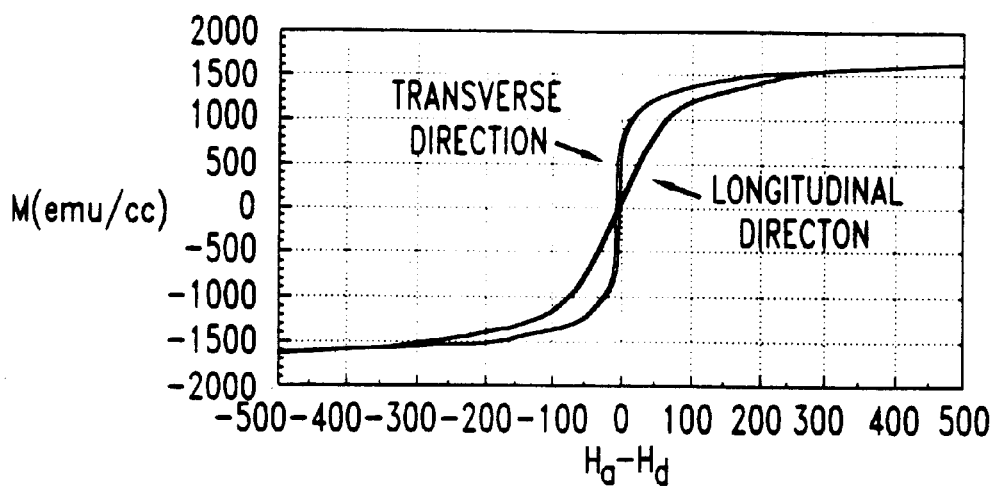
FIG. 4 shows the magnetic hysteresis of a Co-30% Fe alloy of the invention.

It is possible to use the deformed and heat treated Co—Fe alloy in a component in any suitable orientation. However, for best magnetostriction, the alloy is oriented in an elongated portion of the component such that the elongation direction is 90° transverse (or at least 45° off) to the direction of plastic deformation (e.g., the direction of cold or hot rolling). This result in illustrated in FIG. 3, which shows the magnetostriction for a Co-30 wt. % Fe alloy plate cold rolled 75% and then heat treated at 820° C. for 40 minutes in the long direction (parallel to the direction of rolling) and transverse direction (perpendicular to the rolling direction). The magnetostriction is clearly smaller in the long direction than the transverse direction. FIG. 4 shows the hysteresis of a similarly-treated alloy in the long and transverse directions, illustrating coercivities below 20 Oe in the alloy of the invention.

Figure 5A:
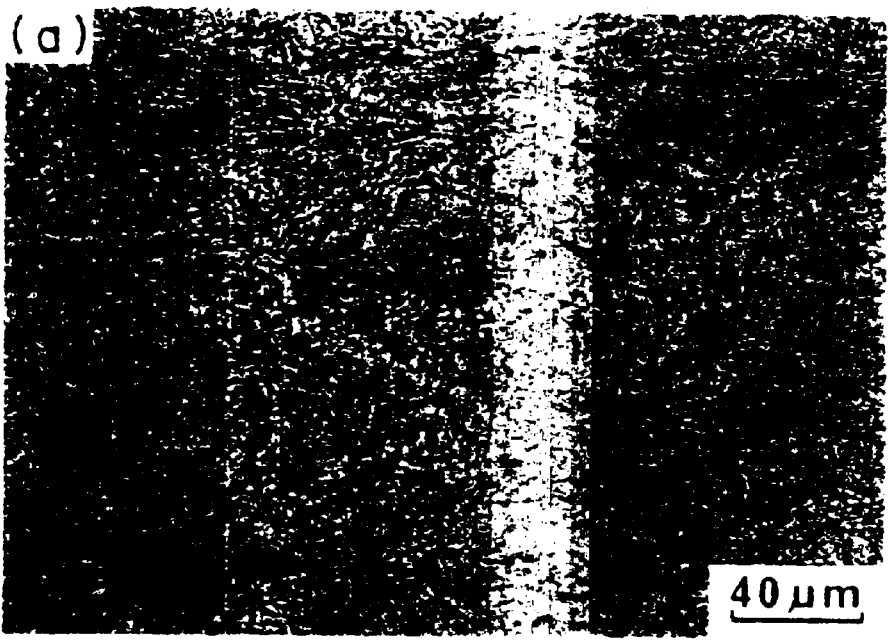
FIGS. 5A and 5B are scanning electron micrographs of the microstructure of Co-30% Fe alloy plates, as-rolled, and cold rolled and then annealed at 820° C. for 40 minutes, respectively.
Figure 5B:
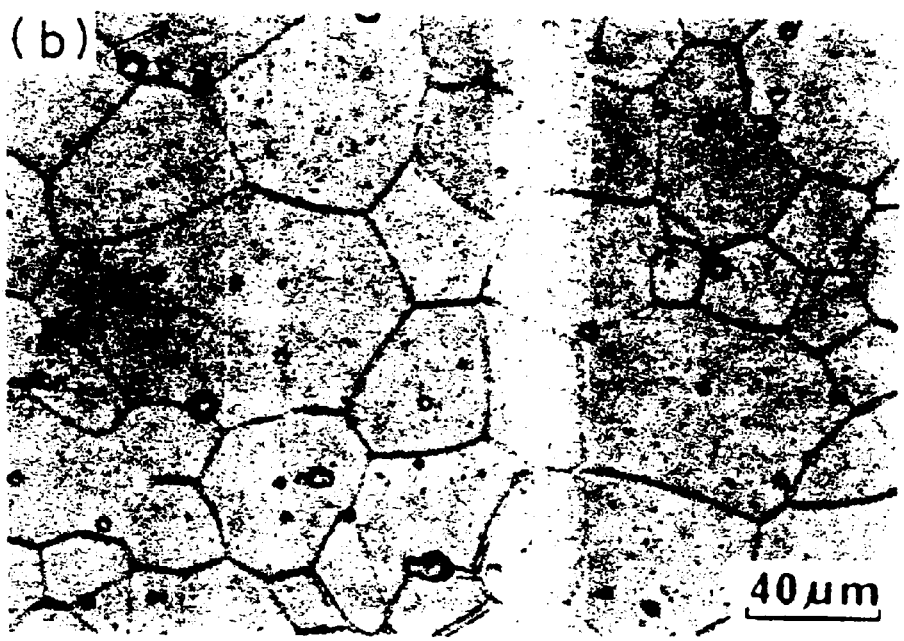

The heat treating of the deformed structure provides a substantially fully crystallized material with the above-noted preferential texture. The microstructure of the Co—Fe alloys of the invention are illustrated in FIGS. 5A and 5B. FIG. 5A shows a Co-30 wt. % Fe alloy after 75% cold rolling. FIG. 5B shows the same material after heat treating at 820° C. for 40 minutes. A substantial change is clearly seen. In addition, the Co—Fe alloy is capable of being made ductile by quenching (e.g. by water cool) from the temperature of heat treatment, the quenching substantially avoiding an ordering transformation that contributes to brittleness. Attaining such ductility makes it possible to shape the alloy into a desired component configuration by a relatively easy technique, e.g., machining, press-deformation, cutting, or grinding. Such quenching is typically performed at a rate of at least 100° C./second.

Figure 6A:
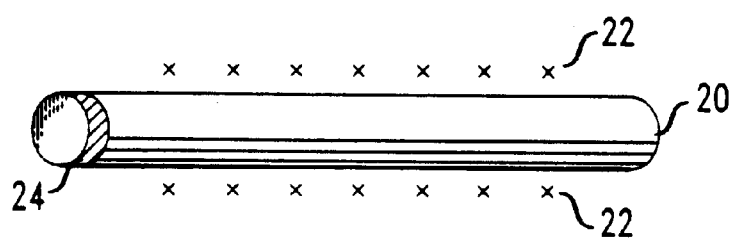
FIGS. 6A and 6B illustrate transducers containing the Co—Fe alloy of the invention.
Figure 6B:
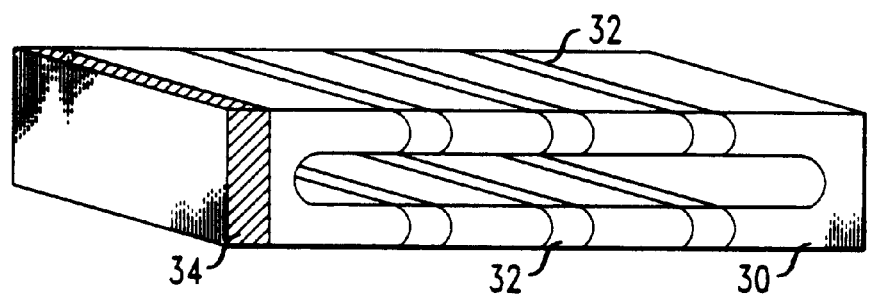

The high magnetostrictive material of the invention is useful for a variety of components. One such component is a magnetostrictive transducer. In the presence of an alternating magnetic field, e.g., as provided by solenoid carrying an AC current, the alternating magnetostrictive expansion and contraction of the material generates mechanical vibration and acoustic waves, including ultrasonic sound. FIGS. 6A and 6B illustrate transducers containing a Co—Fe alloy of the invention. In FIG. 6A, an elongated rod 20 of the alloy is actuated by AC magnetic field supplied by solenoid windings 22 to induce mechanical vibration and ultrasonic sound which propagate through the length of the Co—Fe rod 20 toward the right side. In this particular case, the left end of the rod 20 is in contact with a damping pad 24 so that the acoustic wave does not travel toward left. In FIG. 6B, the Co—Fe alloy is shaped into an elongated ring 30 with the horizontal legs perpendicular to the prior rolling direction for desirable magnetostriction. The Co—Fe alloy is again AC actuated by windings 32, and the alloy ring 30 is provided with a damping pad 34 to control the travel of the acoustic wave.

Figure 7A:
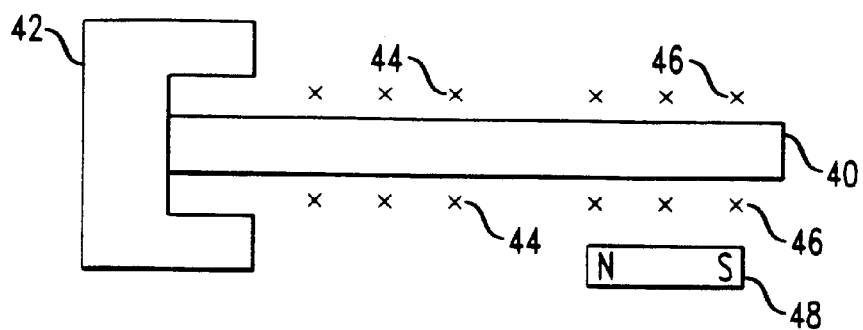
FIGS. 7A and 7B illustrate a magnetostrictive frequency filter and magnetostrictive signal delay line utilizing the Co—Fe alloy of the invention.

It is also possible to use the Co—Fe alloy in a magnetostrictive frequency filter, as illustrated in FIG. 7A. In the filter, the left end of the Co—Fe alloy rod 40 is dampened by a damping pad 42. An AC input voltage signal applied to the transmitting coil 44 actuates the magnetostrictive rod 40 through a pulse AC magnetic field, causing the rod 40 to vibrate at its resonant frequency, which is dependent on the rod 40 geometry. The mechanical vibration causes the magnetization of the rod 40 near the receiving coil 46 to oscillate via an inverse magnetostriction effect, thus inducing an alternating voltage in the receiving coil. This action is efficient only when the input signal frequency is nearly equal to the resonant frequency of the rod. Thus, only a relatively narrow range of frequencies is passed through the filter. In addition, it is possible to magnetically bias the Co—Fe material near the receiving coil 46 by use of a biasing magnet 48. Such a magnet 48 is useful if the remanent magnetization in the alloy is not able to provide sufficient base magnetization to fluctuate upon AC actuation.

Figure 7B:
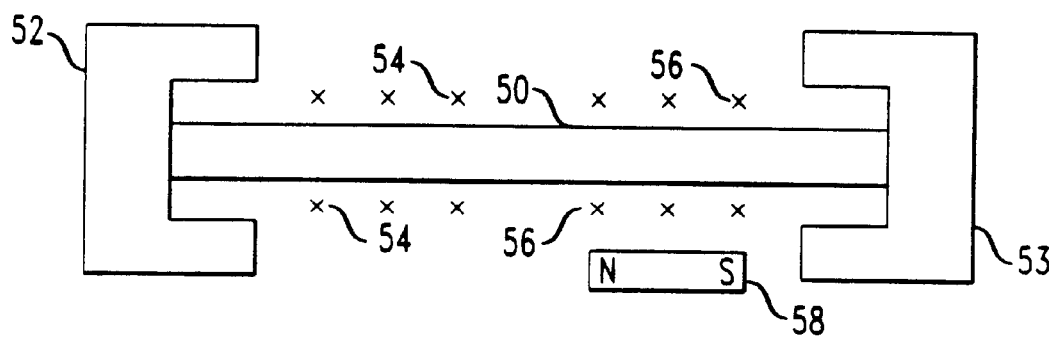

The Co—Fe magnetostrictive alloy is also useful in a magnetostrictive signal delay line, as illustrated in FIG. 7B. In the delay line, both ends of the rod 50 are dampened by dampers 52, 53 to absorb the acoustic wave and prevent reflection. The acoustic wave pulse generated by the transmission coil 54 travels down the Co—Fe rod 50 to the receiving coil 56, and the signal is delayed by this travel time. Such signal delay lines are useful for devices such as radar circuits.

The Co—Fe magnetostrictive alloy is also useful in optical communication devices, e.g., optical fiber grating devices. Optical gratings are important elements for selectively controlling specific wavelengths of light within optical systems such as optical communication systems. Such gratings include Bragg gratings, long period gratings and diffraction gratings. A typical Bragg grating comprises a length of optical waveguide, such as optical fiber, having a plurality of perturbations in the index of refraction substantially equally spaced along the waveguide length. These perturbations selectively reflect light of wavelength l equal to twice the spacing Λ between successive perturbations times the effective refractive index, according to the well-known relationship $\lambda = 2n_{eff}\Lambda$, where λ is the vacuum wavelength and neff is the effective refractive index of the propagating mode. The remaining wavelengths pass essentially unimpeded. Such Bragg gratings have found use in a variety of applications including filtering, adding and dropping signal channels, stabilizing of semiconductor lasers, reflecting fiber amplifier pump energy, and compensating for waveguide dispersion. A difficulty with conventional Bragg gratings, however, is that they filter only a fixed wavelength. Each grating selectively reflects only light in a narrow bandwidth. Yet, in many applications, such as wavelength division multiplexing (WDM), it is desirable to have a reconfigurable grating whose wavelength response is able to be controllably altered.

Figure 8:
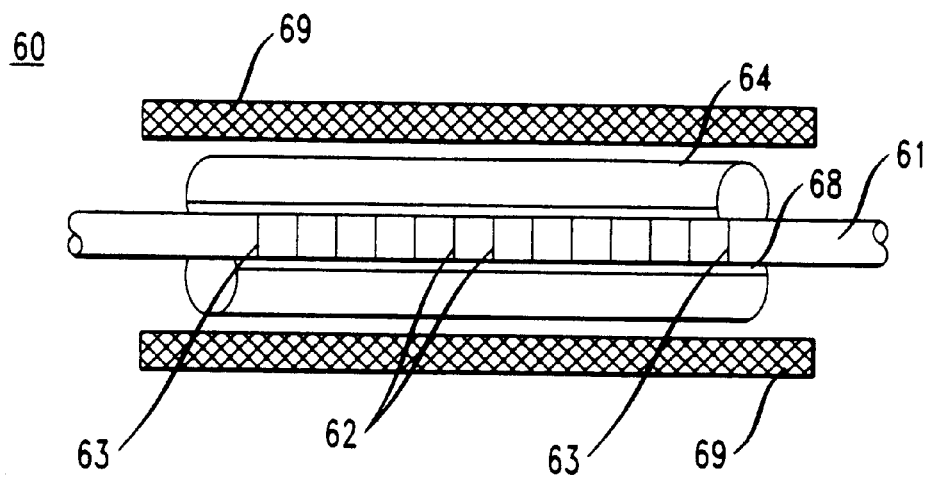
FIG. 8 illustrates a magnetostrictively tunable fiber grating device containing the Co—Fe alloy of the invention.

Magnetostrictive tuning allows for such reconfigurable gratings, as reflected, for example, in U.S. Pat. No. 5,812,711, the disclosure of which is hereby incorporated by reference. FIG. 8 illustrates a magnetostrictively tunable long-period fiber grating device 60 having a length of optical fiber 61 including a grating region 63 having a number of perturbations 62. The fiber at the grating region 63 is secured at an attachment region 68 to a body 64 of magnetostrictive material for transmitting compressive or tensile strain to the fiber 61. The body 64 is generally a cylinder concentrically surrounding the fiber grating region 63, but other configurations are possible, such as a block or a pair of rods. An electromagnet, e.g., a solenoid 69, is located adjacent the body 64 for providing a controllable magnetic field to strain the body 64 along the direction of the fiber grating 63. It is possible for the attachment region 68 to involve mechanical attachment, such as by clamping, or bonding, such as with epoxy or solder. When the body 64 is cylindrical, the fiber is generally attached to the inner bore of the cylinder. When solder is used at the attachment region 68, the fiber surface is desirably coated with a metal layer to improve solder bond strength. If the strain induced on the fiber is tensile, it is possible for the attachment region between the magnetostrictive body and the fiber to be restricted to areas outside the grating.

The body 64 contains the Co—Fe alloy of the invention, which expands or contracts in length when an externally applied magnetic field magnetizes the material and aligns internal magnetic domains. Application of short duration magnetic pulses alter the length of the body 64, thereby altering the length (and spacing) of the attached fiber grating 63. The magnetic pulses are typically produced by applying current pulses to the solenoid 69 from a source of pulsed current (not shown). For a nominal (median) beam wavelength for optical fiber communication of about 1550 nm, a 100 ppm magnetostrictive strain induced by the magnetostrictive alloy will shift the grating wavelength by about 0.15 nm. It is possible for this strain to be amplified, if desired, by mechanical means such as a mechanical lever assembly, or by using a multilayer stack of the magnetostrictive material and a non-magnetic (or negative magnetostrictive) material in an alternating sequence. Such a tunable device is capable of a variety of uses, e.g., as a wavelength-tunable optical signal filter, a wavelength channel add/drop multiplexer, or a signal dispersion compensator.

Other embodiments of the invention will be apparent to those skilled in the art from consideration of the specification and practice of the invention disclosed herein.

What is claimed is:

1. An article comprising:
   an alloy comprising 25 to 40 weight percent iron and 60 to 75 weight percent cobalt, the alloy exhibiting a magnetostriction of at least $100 \times 10^{-6}$ in a magnetic field less than 400 Oe, and the alloy exhibiting a polycrystalline microstructure with a grain size, in average diameter, of at least 2 $\mu$m.

2. The article of claim 1, wherein the alloy exhibits a magnetostriction of at least $100 \times 10^{-6}$ in a magnetic field less than 100 Oe.

3. The article of claim 1, wherein the alloy exhibits a coercivity less than 20 Oe.

4. The article of claim 1, wherein the alloy further comprises one or more elements selected from Cr, Ni, Mn, Cu, Zn, Al, Ti, V, Zr, Nb, Mo, Ag, Hf, Ta, W, Mg, Ca, C, N, and B, in a total amount of 10 weight percent or less.

5. The article of claim 1, wherein the alloy comprises a portion of a component selected from a transducer, a frequency filter, a signal delay line, and an optical fiber grating device.

6. The article of claim 1, wherein the alloy exhibits a grain size, in average diameter, of at least 10 $\mu$m.

* * * * *